United States Patent [19]
Pasch et al.

[11] Patent Number: 5,424,896
[45] Date of Patent: Jun. 13, 1995

[54] SEMICONDUCTOR PACKAGE ELECTROSTATIC DISCHARGE DAMAGE PROTECTION

[75] Inventors: Nicholas F. Pasch, Pacifica; William Gascoyne, San Jose, both of Calif.

[73] Assignee: LSI Logic Corporation, Milpitas, Calif.

[21] Appl. No.: 105,833

[22] Filed: Aug. 12, 1993

[51] Int. Cl.⁶ .............................................. H02H 3/22
[52] U.S. Cl. ...................................... 361/56; 361/91; 361/111; 361/118; 361/130
[58] Field of Search ................... 361/56, 91, 111, 118, 361/119, 130, 129, 212; 357/72, 84

[56] References Cited

U.S. PATENT DOCUMENTS 4,791,524 12/1988 Teigen et al. ...................... 361/212
4,953,007 8/1990 Erdos ..................... 357/84

Primary Examiner—Marc S. Hoff
Assistant Examiner—S. Jackson
Attorney, Agent, or Firm—Poms, Smith, Lande & Rose

[57] ABSTRACT

A semiconductor circuit package includes features forming an electrostatic charge distribution network having nodes which are defined by the electrical contact leads of the package for the semiconductor circuit, and which are effectively connected with one another by spark-gaps. In one embodiment electrical leads of the package are provided with pointed protrusions lying in the plane of the electrical leads. Accordingly, an inadvertent electrostatic discharge is distributed throughout the semiconductor circuit at safe voltage levels determined by the characteristics of the spark gaps of the charge distribution network.

10 Claims, 1 Drawing Sheet

SEMICONDUCTOR PACKAGE ELECTROSTATIC DISCHARGE DAMAGE PROTECTION

BACKGROUND OF THE INVENTION

1. Field of the Invention

The present invention is in the field of semiconductor circuit devices. More particularly, the present invention relates to a package for a semiconductor circuit chip, which package by its configuration greatly assists to protect the semiconductor circuit on the chip and within the package from the damaging effects of electrostatic discharge.

2. Related Technology

Semiconductor circuit devices are generally formed on a substrate of material, such as silicon, capable of forming a semiconductor material when doped with certain impurities. These semiconductor circuit devices normally include a number of structural circuit features of exceedingly small-scale. Typically these small scale circuit features are formed with the use of conventional photolithographic techniques, including use of photo resists, etching, and such techniques as vapor-phase deposition, and electron beam epitaxy, to form circuit element configurations of microscopic scale.

Such circuits are generally formed in groups on a large segment of the substrate material, and then are separated into individual circuits and subsequently packaged. The individual semiconductor circuit devices are generally referred to as "chips". These circuit device chips are typically packaged in combination packages which include plastic, metal and perhaps ceramic component parts, and which provide environmental protection for the semiconductor circuit, as well as providing for electrical connection of the semiconductor circuit with other electrical circuitry outside of the package.

Common semiconductor package configurations include the dual-in-line-package (DIP), which includes two rows of electrical contacts along opposite edges of the package. Also, a popular package configuration is the quad package, which is square or rectangular and has electrical contacts for the integrated circuit along each of its four edges. Another configuration of package includes plural electrical contact pins in a rectangular array which substantially covers the lower surface of the package.

The operating voltages for these semiconductor circuit devices at the levels of the small-scale structural circuit features is generally only a few volts. Accordingly, these devices are typically susceptible to damage or destruction if exposed to sufficiently large electrostatic discharges. In fact, the level of electrostatic charge which a person can accumulate on their body, for example on a day of low humidity, and from merely walking across a carpet of synthetic fibers is sufficient to badly damage or destroy many semiconductor devices, if this electrostatic charge is discharged into the device. In fact, the sensitivity of some semiconductor circuit devices to damage from electrostatic discharge is such that a person who is carrying an electrostatic charge on their body and who handles such a device may not even notice the discharge from their body into the device. However, the semiconductor circuit device may still be damaged beyond use by such an unnoticed electrostatic discharge.

Accordingly, safe handling practices have been developed for use in association with semiconductor circuit devices. These practices include such precautions as using grounded tools, grounding a worker's body, and using grounded conductive mats on work bench tops and floors. In addition to the development of safe handling practices and procedures for observance in connection with semiconductor circuit devices, electrostatic discharge protection (edp) circuitry has been developed which is embedded in the devices themselves. However, safe handling practices and procedures are not always followed, and the embedded electrostatic discharge protection circuitry is then called upon to protect a circuit from damage or destruction from an inadvertent electrostatic discharge.

Unavoidably, conventional embedded electrostatic discharge protection circuitry preempts valuable space on a semiconductor circuit chip. In addition to taking valuable area on the surface of the semiconductor chip, such conventional electrostatic discharge protection circuitry is itself of limited effectiveness. That is, the semiconductor circuit may not be effectively protected fully from the damaging effects of an electrostatic discharge.

A conventional structure for protecting delicate circuit elements that have already been mounted on a printed circuit board is seen in U.S. Pat. No. 5,029,041, (hereinafter, the '041 patent) issued 2 Jul. 1991, to R. C. Robinson, et al. The '041 patent concerns the provision of a peripheral circuit path, connected to a reference potential point, which is provided with plural outwardly disposed pointed protrusions. These protrusions point toward the direction of anticipated electrostatic discharge. In effect, the teaching of the '041 patent is an adaptation of the old concept inherent in the technique of providing lightning rods on the roof of a barn. Such lightning rods are provided with an earth (reference potential) connection to which it is hoped that the current surge from lightning (a large scale electrostatic discharge) will be drained.

However, the concept of the '041 patent is seen to have only limited or no applicability to the protection of integrated circuits that have not yet been installed in a printed circuit board. The integrated circuits in such a context are at greatest risk when they are being handled for insertion into or removal from a circuit board. Under these conditions, a grounded current drain (point of reference potential) is not available at the integrated circuit. To avoid electrostatic discharge induced damage or destruction to integrated circuit chips that have not yet been inserted in a printed circuit board it is typically necessary to employ the grounded tools, grounded conductive mats on work benches and the other cumbersome conventional safe handling practices for semiconductor circuit devices discussed above.

Moreover, when such safe handling practices are not followed, and the circuit device is being handled, the integrated circuit is at a floating potential with respect to ground, and is isolated from ground, so that the current surge from an electrostatic discharge into the circuit damages the circuit elements as it flows to the floating potential voltage level of the circuit. By analogy, this current flow to the integrated circuit might be visualized as the charging of a capacitor which is isolated at its contacts so that it is at a floating potential. In such a situation, an electrostatic discharge can flow into the capacitor and be distributed as charge on the plates of the capacitor. When such an electrostatic discharge current flows into an isolated integrated circuit, the voltage and current flow levels are too often such that they damage circuit components as they are distributed within the circuit.

SUMMARY OF THE INVENTION

In view of the deficiencies of the conventional expedients for protecting integrated circuits from damage by electrostatic discharge, a primary object for this invention is to provide a structure that protects a semiconductor package from electrostatic discharge damage. Protection of a semiconductor circuit from damage caused by an inadvertent electrostatic discharge may be substantially improved by providing a structure inherent in the package for the integrated circuit device itself and which insures distribution of an electrostatic discharge over the volume of the circuit device without the discharge flowing through the circuit device itself at levels sufficiently high as to cause damage to the circuit device. Thus, the minute integrated circuit elements of the device are protected from the voltage and current surges which such an electrostatic discharge creates because the package structure for the circuit device distributes the charge over the entire device, and portions of the circuit device itself do not develop potential differences between them such that surge currents reach a damaging level.

Accordingly, the present invention provides a semiconductor circuit device having a semiconductor circuit, and a package outwardly providing plural electrical contacts for connection of the semiconductor circuit to electrical circuitry external of the package, with the contacts including respective pointed electrically conductive protrusions pointing toward and in spaced confronting relation with similar electrically conductive protrusions of other electrical contacts.

An advantage of the present invention is that it provides a semiconductor circuit with protection from electrostatic discharge by distributing the current from a discharge throughout the package at voltage levels which are controlled by the spacing between the pointed protrusions of the package leads, and which are at a level low enough that the circuit is not damaged. Also, the package for the circuit device itself provides the protection structure for electrostatic discharge so that the circuit need not be burdened with the conventional EDP circuitry, and the space such EDP circuitry occupies on the surface of the chip can be saved for other uses.

Additional objects and advantages of the present invention will appear from a careful reading of the following description of a particularly preferred exemplary embodiment of the invention taken in conjunction with the following drawing Figures.

DESCRIPTION OF THE DRAWINGS FIGURES

FIG. 1 is a perspective view of a semiconductor circuit device which includes a semiconductor circuit in its package, and which package is generally of the DIP type, and illustrates one preferred embodiment of the present invention;

FIG. 2 provides an enlarged fragmentary elevation view of the semiconductor circuit device seen in FIG. 1;

FIG. 3 provides a perspective view of the semiconductor circuit device seen in FIGS. 1 and 2 preparatory to its insertion into or mounting on a circuit board, which circuit board provides a grounded reference potential for the semiconductor circuit of the device.

DETAILED DESCRIPTION OF THE PREFERRED EMBODIMENT OF THE INVENTION

Figure 1:
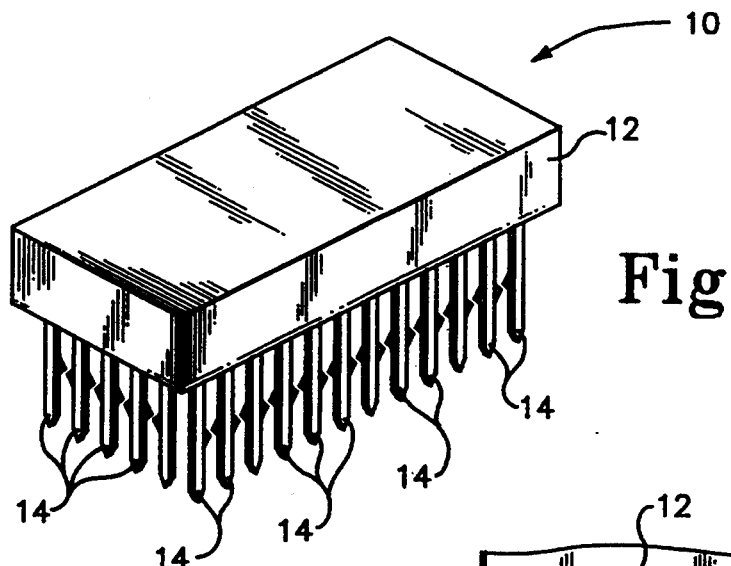
Figure 2:
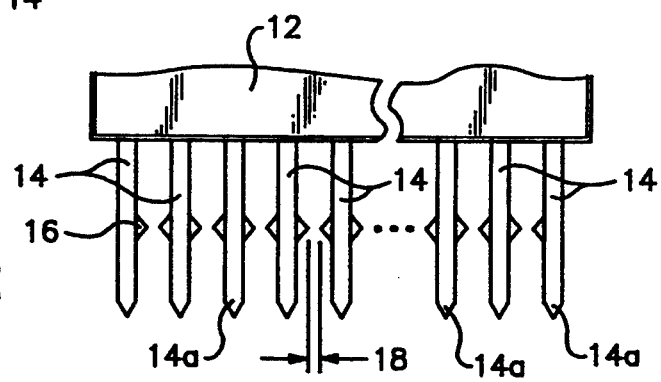

Viewing FIGS. 1 and 2 in conjunction, a semiconductor circuit device 10 is seen as it might be during handling of the device preparatory to its insertion into a printed circuit board which will carry the device 10. As FIG. 1 shows, the semiconductor circuit device 10 includes a package, generally referenced with the numeral 12. Those ordinarily skilled in the pertinent arts will appreciate that the semiconductor circuit device 10 includes a small semiconductor chip (not visible in the drawings), which is housed in the package 12. Additionally, the package 12 provides an electrical lead frame, an outer portion of which is visible in FIG. 1. The lead frame includes plural depending electrically conductive leads, or contacts 14. These contacts 14 internally of the package 12 connect individually with respective lead portions of the lead frame, which leads extend inwardly in the plane of the package 12 and taper to progressively smaller size as they approach the small-scale semiconductor circuit. From the inner ends of the leads, either small scale wire bond conductors or conductive traces on a tape bond, for example, will connect the individual contacts to the respective contact pads of the semiconductor circuit.

FIG. 2 illustrates that the semiconductor circuit device 10 of the preferred embodiment of the present invention additionally includes plural pointed protrusions 16 respectively formed individually on each of the contacts 14, and in spaced confronting relation with the similar protrusions 16 on the remainder of the contacts 14. These pointed protrusions 16 are spaced apart by a distance represented with the numeral 18 in FIG. 2. Below the protrusions, the legs 14 include a portion 14a, which is available for connection of the semiconductor circuit device to external electrical circuitry, either by soldering or by insertion into a socket, for example.

It is generally known that air is a dielectric material with a fairly constant electrical breakdown potential of about 10,000 volts per centimeter. Accordingly, the spacing 18 between the protrusions 16 is chosen to provide an electrical breakdown between adjacent protrusions at a predetermined voltage dependent upon the dielectric constant of the air. Preferably the spacing between adjacent protrusions is about 100 and 200 microns. The resulting voltage level limit which can exist between any one of the contact legs 14 and its next adjacent contact leg is then approximately 1000 to 2000 volts. A differential voltage level higher than this limiting level will cause an air arc to pass between the adjacent contact legs, and the differential voltage level between the adjacent contact legs will subsequently be considerably lower than the limiting voltage level.

The plural spaced contact legs 14, each with at least one pointed protrusion 16 in spaced confronting relation with a pointed protrusion of a next adjacent contact leg 14, represents a charge distribution network, with each contact of the network effectively connected to the next contact in the network by a spark gap. Consequently, in the event an inadvertent electrostatic discharge is conducted to one or more of the contact legs 14 of the semiconductor circuit device 10, this discharge cascades across the adjacent legs as a series of air arcs, with progressively decreasing voltage level and current surge level at each succeeding stage of the cascade. The results of this cascade, and the distribution of voltage and current from an electrostatic discharge, is that the voltage is distributed throughout and across the volume of the semiconductor device 10, and portions of the circuit which are connected with the individual contact legs 14 are thus not exposed to damaging levels of differential voltage therebetween.

Figure 3:
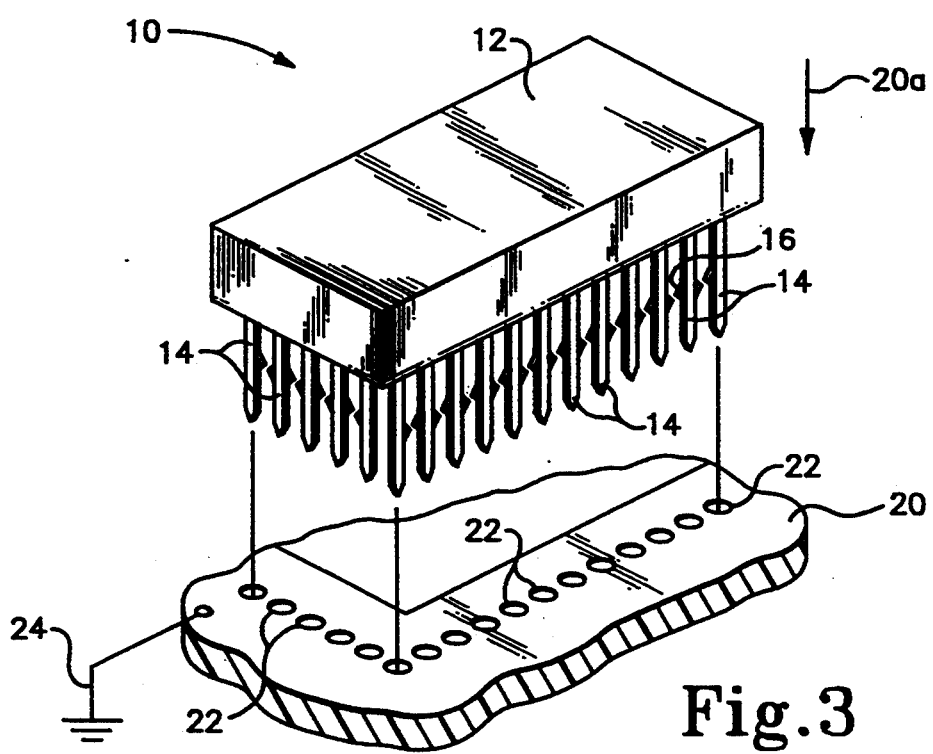

FIG. 3 illustrates that the semiconductor circuit device 10 may be inserted into a circuit board 20, as is indicated by the arrow 20a. This circuit board 20 includes plural apertures 22 into which the contact legs 14 are individually received either for soldering connection to conductors of the circuit board 20, or connection into a connector socket (not shown). Importantly, the circuit board 20 includes a ground connection 24 which will drain the distributed electrostatic charge from the circuit device 10. At this point, the draining of the distributed charge from the device 10 also avoids damage to the device 10 because it has been distributed at safe levels throughout the device. Also, the charge distribution network formed on the plurality of contact legs 14 is also effective at discharge of the electrostatic charge so that again damaging levels of differential voltage cannot be developed in the semiconductor circuit 10.

While the present invention has been depicted, described, and is defined by reference to a particularly preferred embodiment of the invention, such reference does not imply a limitation on the invention, and no such limitation is to be inferred. The invention is capable of considerable modification, alteration, and equivalents in form and function, as will occur to those ordinarily skilled in the pertinent arts. For example, the present embodiment which forms a charge distribution cascade network among the plural contact legs could be replaced with an embodiment which likewise has a pointed protrusion on each contact leg, but which protrusions confront a similar pointed protrusion on a conductive charge distribution ring. In this instance, instead of the electrostatic discharge being distributed in the semiconductor device as a series or cascade of air arcs, each at successively lower voltage levels, the distribution would be by a plurality of simultaneous air arcs each at substantially the same voltage level. Such a constant-voltage arc discharge distribution of the current surge from an electrostatic discharge has the advantage of distributing the accumulated electrostatic charge over the largest possible volume substantially simultaneously at the lowest possible voltage level. However, this embodiment of the invention would require the addition of the charge distribution ring to the semiconductor circuit device 10.

Those ordinarily skilled in the pertinent arts will recognize that the illustrated embodiment of the present invention can be implemented with virtually no cost by the simple expedient of providing the pointed protrusions 16 on the contact legs 14. However, it is to be remembered that the depicted and described preferred embodiment of the invention is exemplary only, and is not exhaustive of the scope of the invention. Consequently, the invention is intended to be limited only by the spirit and scope of the appended claims, giving full cognizance to equivalents in all respects.

We claim:

1. A semiconductor circuit device having a semiconductor circuit, and a package outwardly providing plural electrical contacts for connection of the semiconductor circuit to electrical circuitry external of the package, the electrical contacts of the package connecting with respective portions of the semiconductor circuit, said package comprising:
   a respective pointed electrically conductive protrusion connecting with one of said plural electrical contacts, said pointed protrusion pointing toward and being in spaced confronting relation with a similar electrically conductive protrusion;
   said similar electrically conductive protrusion connecting with one of another electrical contact of said plurality of said contacts, and
   a conductive member which itself includes a pointed protrusion confronting a pointed protrusion of said another electrical contact.

2. The invention of claim 1 where in said package includes a plurality of contact legs depending therefrom respectively defining at least one of said pointed protrusions, with said pointed protrusions respectively confronting a similar pointed protrusion of another of said plurality of contact legs in spaced relation thereto.

3. The invention of claim 1 wherein the spacing between protrusions is generally 100 to 200 microns.

4. A method of protecting a semiconductor circuit from damage resulting from inadvertent discharge of electrostatic charge to or from the semiconductor circuit, said method including the steps of:
   providing an environmentally protective package having plural electrical contacts for connection of the semiconductor circuit to external electrical circuitry;
   providing a pointed protrusion connecting with each one of said plural electrical contacts; and
   providing a charge-distribution spark-gap network effectively connecting each of said pointed protrusions with one another to thereby distribute said electrostatic discharge throughout said semiconductor device at safe voltage levels.

5. The method of claim 4 wherein said step of providing said charge distribution network includes the steps of forming said pointed protrusions on each of said plural electrical contacts, and confronting said pointed protrusions one with another in a certain spaced relation.

6. The method of claim 5 wherein said step of providing said charge distribution network includes the steps of forming pointed protrusions on a charge distribution ring member, and confronting the pointed protrusions of said ring member with said pointed protrusions which connect with said electrical contacts of said package.

7. The invention of claim 5 wherein the spacing between protrusions is generally 100 to 200 microns.

8. A semiconductor device comprising:
   a semiconductor circuit chip;
   a package structure for said semiconductor circuit chip, said package structure externally providing plural electrical contacts for connecting said semiconductor circuit chip with external electrical circuitry, and internally said package structure providing individual electrical connection of said plural electrical contacts with respective electrical contact pads of the semiconductor circuit chip;
   said package structure further including plural electrically conductive pointed protrusions connecting respectively with said plurality of electrical contacts, with said plurality of pointed protrusions confronting in spaced relation thereto a similar pointed protrusion connecting with one of the remainder of said plural electrical contacts.

9. The semiconductor device of claim 8 wherein said package includes plural dependent contact legs which define said plural electrical contacts, each of said dependent contact legs defining at least a respective one of said conductive protrusions, and each protrusion of a contact leg being spaced from and confronting a protrusion of a next-adjacent contact leg to define therewith one of said plural spark gaps.

10. The invention of claim 8 wherein spacing between protrusions is generally 100 to 200 microns.

* * * * *